(12) United States Patent
Uchino et al.

(10) Patent No.: US 11,547,017 B2
(45) Date of Patent: Jan. 3, 2023

(54) COOLING MODULE AND ELECTRONIC APPARATUS

(71) Applicant: Lenovo (Singapore) Pte. Ltd., Singapore (SG)

(72) Inventors: Akinori Uchino, Kanagawa (JP); Takuroh Kamimura, Kanagawa (JP); Hiroshi Yamazaki, Kanagawa (JP); Masayuki Amano, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 17/358,772

(22) Filed: Jun. 25, 2021

(65) Prior Publication Data

US 2022/0015260 A1     Jan. 13, 2022

(30) Foreign Application Priority Data

Jul. 13, 2020    (JP) .............................. JP2020-119910

(51) Int. Cl.
*H05K 7/20*       (2006.01)
*G06F 1/20*       (2006.01)

(52) U.S. Cl.
CPC .......... *H05K 7/2039* (2013.01); *G06F 1/206* (2013.01); *H05K 7/20136* (2013.01)

(58) Field of Classification Search
CPC .............. H01L 23/3672; H01L 23/367; H01L 23/3675; H01L 21/4871; H01L 35/30; F28D 15/0233; F28D 15/046; F28D 2021/0028; F28D 1/03; F28D 1/0308; F28D 15/00; F28D 2020/0013; G06F 1/20; G06F 2200/201; G06F 1/206; H05K 7/2039;
(Continued)

(56) References Cited

U.S. PATENT DOCUMENTS 7,916,482 B2 *   3/2011   Tomioka ............. F28D 15/0266
                                                                             165/80.4
2007/0002537 A1 *   1/2007   Tomioka ................. G06F 1/203
                                                                            361/695
(Continued)

FOREIGN PATENT DOCUMENTS

EP        E P-3328175 A1 *   5/2018  ............... G06F 1/20
JP         2004-015024 A      1/2004
(Continued)

*Primary Examiner* — Michael A Matey
(74) *Attorney, Agent, or Firm* — Osha Bergman Watanabe & Burton LLP

(57) ABSTRACT

A cooling module reduces the number of parts and achieves weight reduction. An electronic apparatus includes: the cooling module; a chassis; first and second heating elements provided inside the chassis; and a cooling module configured to absorb heat generated by the first and second heating elements. The cooling module includes: a vapor chamber in which a sealed space is formed in a portion sandwiched between first and second metal plates and working fluid is sealed in the sealed space, the second metal plate having an outer shape larger than that of the first metal plate; a metal frame formed in a portion of the second metal plate, the portion of the second metal plate protruding from the outer shape of the first metal plate; and a heat conduction plate supported by the metal frame, the heat conduction plate containing graphene.

8 Claims, 7 Drawing Sheets

(58) Field of Classification Search
CPC ............. H05K 1/0203; H05K 7/20336; H05K 7/20154; H05K 7/20272; H05K 7/20418; H05K 7/20509; H05K 1/181; H05K 7/20254; H05K 7/20263; H05K 7/20309; H05K 7/20318; H05K 7/20327; H05K 1/0201; H05K 2201/066; H05K 7/20; H05K 7/20136
See application file for complete search history.

(56) References Cited

U.S. PATENT DOCUMENTS

| | | | |
|---|---|---|---|
| 2007/0002538 A1* | 1/2007 | Tomioka | G06F 1/203 361/695 |
| 2010/0139895 A1* | 6/2010 | Hwang | H01L 23/427 165/104.26 |
| 2010/0149755 A1* | 6/2010 | Tomioka | F28D 15/043 165/104.26 |
| 2010/0265709 A1* | 10/2010 | Liu | F21K 9/00 362/249.02 |
| 2010/0271774 A1* | 10/2010 | Peng | H01L 23/467 361/679.52 |
| 2011/0056670 A1* | 3/2011 | Meyer, IV | H01L 23/3672 165/122 |
| 2011/0174474 A1* | 7/2011 | Liu | C23C 28/30 165/185 |
| 2012/0160456 A1* | 6/2012 | Aoki | H01L 23/427 165/104.26 |
| 2013/0168058 A1* | 7/2013 | Chamseddine | F28D 7/0075 165/104.26 |
| 2015/0323262 A1* | 11/2015 | Kim | F28F 21/081 165/104.21 |
| 2017/0367219 A1* | 12/2017 | Hsieh | H05K 7/20172 |
| 2018/0157297 A1* | 6/2018 | Delano | H01L 21/4871 |
| 2018/0313615 A1* | 11/2018 | Nakamura | G06F 1/20 |
| 2018/0372419 A1* | 12/2018 | Liu | F28D 15/0275 |
| 2019/0116691 A1* | 4/2019 | Bozorgi | H01L 23/427 |
| 2019/0239391 A1* | 8/2019 | Hsiao | H05K 7/20336 |
| 2019/0254196 A1* | 8/2019 | Ma | H05K 7/1489 |
| 2019/0324507 A1* | 10/2019 | Carbone | H05K 7/20336 |
| 2020/0018555 A1* | 1/2020 | Lin | F28D 15/0275 |
| 2020/0025457 A1* | 1/2020 | Lin | F28D 15/0233 |
| 2020/0196482 A1* | 6/2020 | Chiang | H05K 7/20154 |
| 2020/0221606 A1* | 7/2020 | Lee | F28D 15/0233 |
| 2020/0232712 A1* | 7/2020 | Hsieh | H01L 23/3731 |
| 2020/0352054 A1* | 11/2020 | Schmit | H05K 7/20336 |
| 2020/0355445 A1* | 11/2020 | Chen | H01L 23/3675 |
| 2021/0136949 A1* | 5/2021 | Lin | B32B 3/08 |
| 2021/0195799 A1* | 6/2021 | Liu | F28F 3/044 |
| 2022/0011054 A1* | 1/2022 | Hanano | H01L 23/427 |

FOREIGN PATENT DOCUMENTS

| | | |
|---|---|---|
| JP | 2005-071585 A | 3/2005 |
| JP | 2005-129734 A | 5/2005 |
| JP | 6469183 B2 | 2/2019 |
| WO | 2016/151916 A1 | 9/2016 |
| WO | 2019/049781 A1 | 3/2019 |

* cited by examiner

COOLING MODULE AND ELECTRONIC APPARATUS

CROSS-REFERENCE TO RELATED APPLICATIONS

Priority is claimed on Japanese Patent Application No. 2020-119910 filed on Jul. 13, 2020, the content of which is incorporated herein by reference.

TECHNICAL FIELD

The present invention relates to a cooling module and an electronic apparatus including the cooling module.

BACKGROUND

An electronic apparatus such as a laptop PC (laptop personal computer) houses therein a plurality of heating elements including CPU. Such the electronic apparatus is equipped with a cooling module inside a chassis to be able to diffuse heat generated by the heating elements to radiate the heat to the outside.

PATENT LITERATURE

[Patent Document 1] Japanese Patent No. 6469183. The conventional cooling module typically includes a vapor chamber is which working fluid is sealed in a sealed space between two metal plates and a heat diffusion plate that is formed of a copper plate. For this reason, such the cooling module has a large number of parts and takes time and effort to assemble the module inside the chassis. Moreover, the metallic heat diffusion plate is difficult to reduce weight and thus increases the weight of an electronic apparatus.

SUMMARY

One or more embodiments provided a cooling module, which can reduce the number of parts and can reduce weight, and an electronic apparatus including the cooling module.

An electronic apparatus according to one or more embodiments of the present invention includes: a chassis; first and second heating elements provided inside the chassis; and a cooling module configured to absorb heat generated by the first and second heating elements. The cooling module includes: a vapor chamber in which a sealed space is formed in a portion sandwiched between first and second metal plates and working fluid is sealed in the sealed space, the second metal plate having an outer shape larger than that of the first metal plate; a metal frame formed in a portion of the second metal plate, the portion of the second metal plate protruding from the outer shape of the first metal plate; and a heat conduction plate supported by the metal frame, the heat conduction plate containing graphene. The vapor chamber is arranged to be able to absorb the heat generated by the first heating element, and the heat conduction plate is arranged to be able to absorb the heat generated by the second heating element.

An electronic apparatus according to one or more embodiments of the present invention includes: a chassis; first and second heating elements provided inside the chassis; and a cooling module configured to absorb heat generated by the first and second heating elements. The cooling module includes: a metal plate; a first heat conduction plate fixed to a first surface of the metal plate, the first heat conduction plate containing graphene and having a portion provided to protrude from an outer shape of the metal plate; a second heat conduction plate fixed to the first surface or a second surface of the metal plate, the second heat conduction plate containing graphene; a metal sheet fixed to the portion of the first heat conduction plate protruding from the outer shape of the metal plate in an attaching surface of the first heat conduction plate with respect to the metal plate; a cooling fin joined to the metal sheet; and a blower fan that is able to blow air to the cooling fin. The first heat conduction plate is arranged to be able to absorb the heat generated by the first heating element, and the second heat conduction plate is arranged to be able to absorb the heat generated by the second heating element.

A cooling module according to one or more embodiments of the present invention includes: a vapor chamber in which a sealed space is formed in a portion sandwiched between first and second metal plates and working fluid is sealed in the sealed space, the second metal plate having an outer shape larger than that of the first metal plate; a metal frame formed in a portion of the second metal plate, the portion of the second metal plate protruding from the outer shape of the first metal plate; and a heat conduction plate supported by the metal frame, the heat conduction plate containing graphene.

A cooling module according to one or more embodiments of the present invention includes: a metal plate; a first heat conduction plate fixed to a first surface of the metal plate, the first heat conduction plate containing graphene and having a portion provided to protrude from an outer shape of the metal plate; a second heat conduction plate fixed to the first surface or a second surface of the metal plate, the second heat conduction plate containing graphene; a metal sheet fixed to the portion of the first heat conduction plate protruding from the outer shape of the metal plate in an attaching surface of the first heat conduction plate with respect to the metal plate; a cooling fin joined to the metal sheet; and a blower fan that is able to blow air to the cooling fin.

One or more embodiments of the present invention can reduce the number of parts and can reduce weight.

DETAILED DESCRIPTION OF THE INVENTION

Hereinafter, embodiments of an electronic apparatus and a cooling module according to the present invention will be described in detail with reference to the accompanying drawings.

Figure 1:
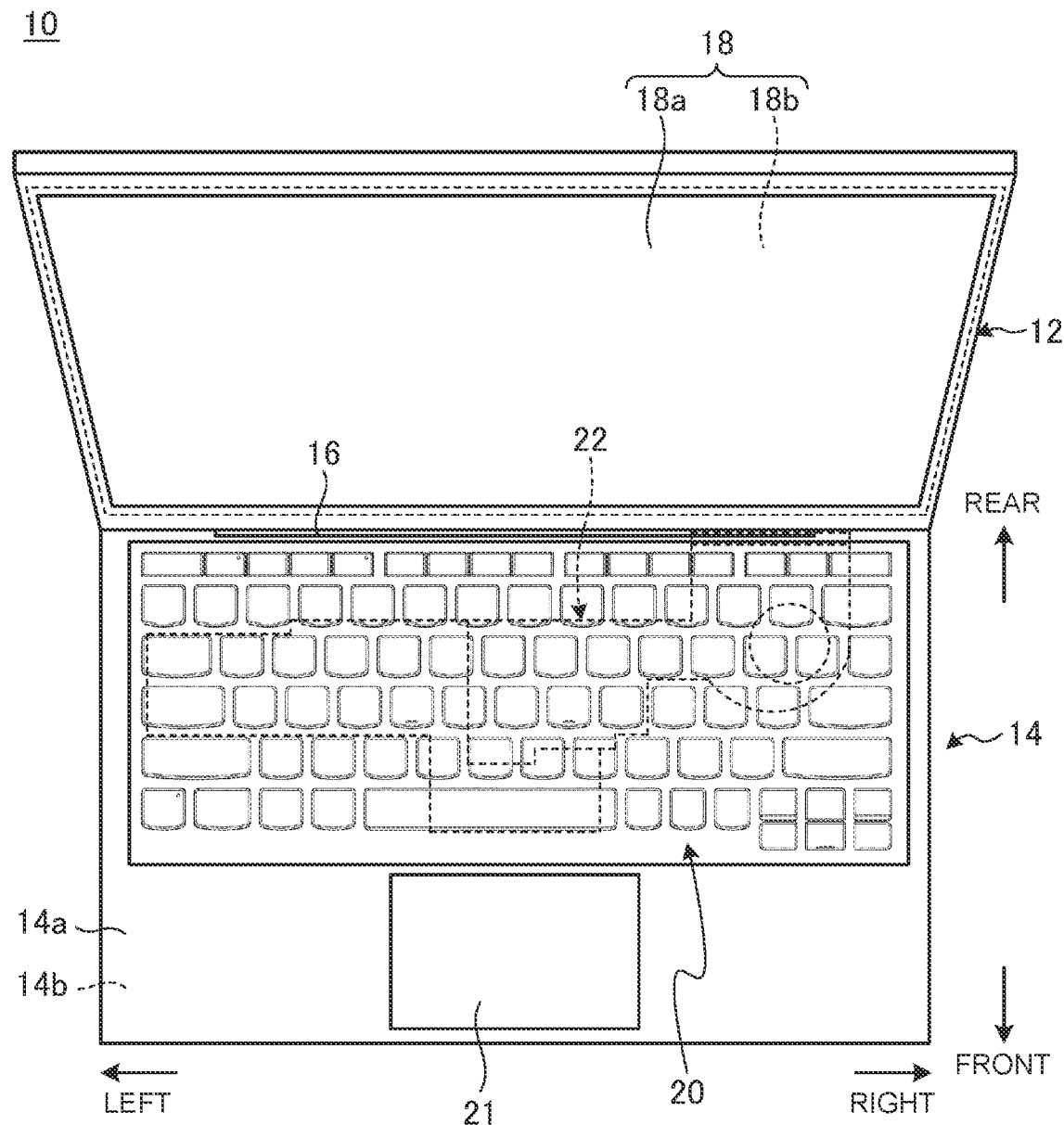
FIG. 1 is a schematic plan view illustrating an electronic apparatus according to one or more embodiments when looking down on it from above.

FIG. 1 is a schematic plan view illustrating an electronic apparatus 10 according to one or more embodiments when looking down on it from above. As illustrated in FIG. 1, the electronic apparatus 10 is a clamshell laptop PC in which a display chassis 12 and a chassis 14 are connected by a hinge 16 so as to be relatively rotatable. The electronic apparatus according to the present invention may be a mobile phone, a smartphone, a handheld game console, etc., in addition to the laptop PC.

The display chassis 12 is a flat box thinner than the chassis 14. The display chassis 12 is equipped with a display 18. The display 18 includes a display unit 18a displaying an image and a touch panel unit 18b for touch operation. The display unit 18a is composed of organic EL (OLED: Organic Light Emitting Diode) or liquid crystal, for example. The touch panel unit 18b may be omitted.

Hereinafter, for the chassis 14 and each component mounted on the chassis, based on a state where the display chassis 12 is opened at a predetermined angle and the display 18 is visually recognized as illustrated in FIG. 1, the near side is referred to as the front, the far side is referred to as the rear, the width direction is referred to as the left and right, and the thickness direction is referred to as the up and down.

The chassis 14 is a flat box. The rear end of the chassis 14 is connected to the hinge 16. The chassis 14 is composed of a top cover member 14a forming a top surface and four peripheral sides and a bottom cover member 14b forming a bottom surface. A keyboard 20 and a touch pad 21 are provided on the top surface of the chassis 14. A cooling module 22 according to one or more embodiments is mounted inside the chassis 14.

Figure 2:
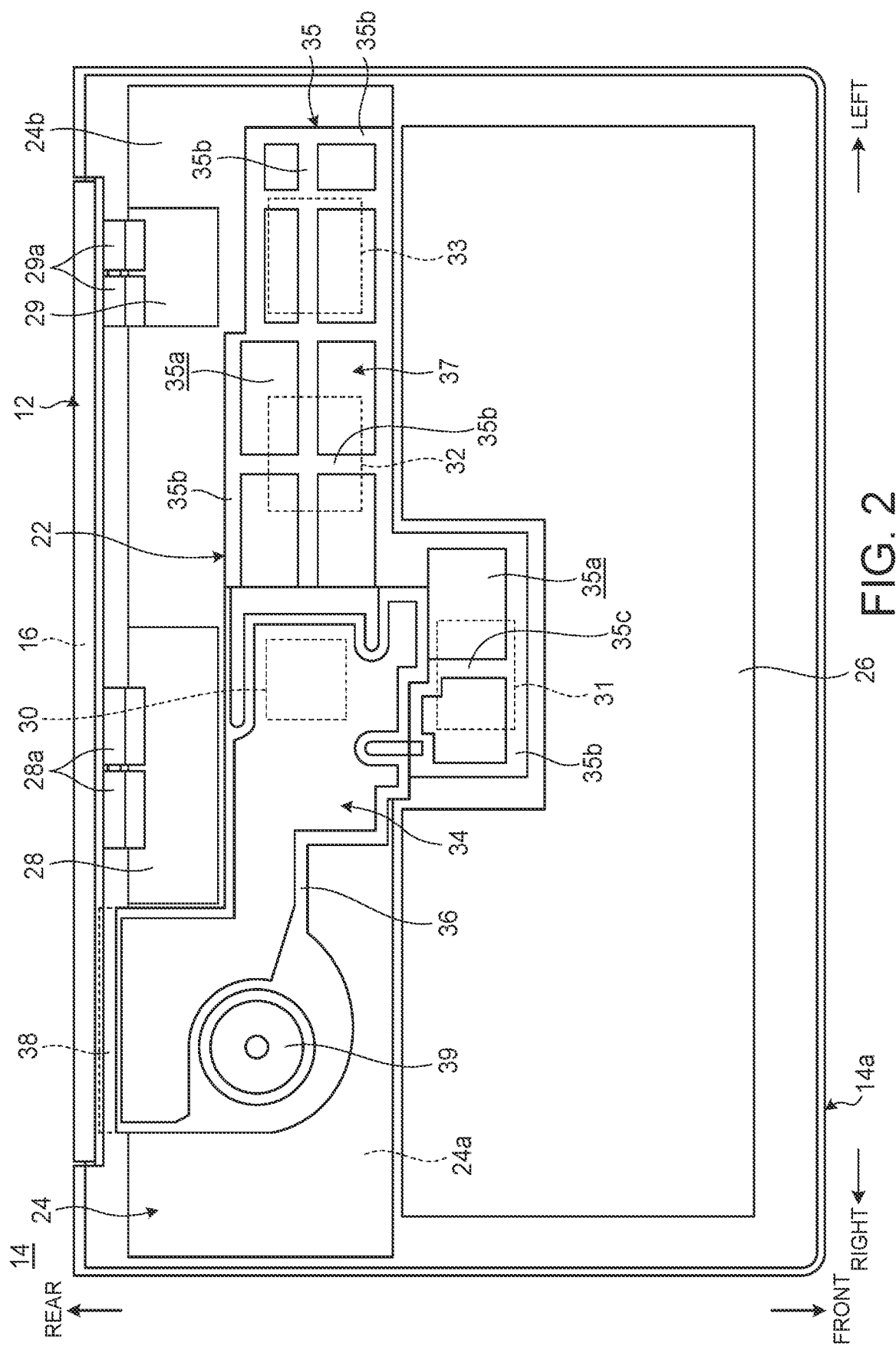
FIG. 2 is a bottom view schematically illustrating an internal structure of a chassis.

FIG. 2 is a bottom view schematically illustrating an internal structure of the chassis 14. FIG. 2 is a diagram in which the inside of the chassis 14 is viewed from the inner side of the top cover member 14a after the bottom cover member 14b is removed. As illustrated in FIG. 2, the cooling module 22 and various electronic components, such as a motherboard 24, a battery device 26, a display board 28, and a touch panel board 29, are mounted inside the chassis 14.

The battery device 26 is a rechargeable battery serving as the power source of the electronic apparatus 10. The display board 28 is a sub-board for controlling the image display on the display unit 18a. The display board 28 is electrically connected to the display unit 18a via a flexible board 28a extending between the chassis 12 and 14. The touch panel board 29 is a sub-board for controlling the touch panel unit 18b. The touch panel board 29 is electrically connected to the touch panel unit 18b via a flexible board 29a extending between the chassis 12 and 14. The display board 28 and the touch panel board 29 are arranged at the rear of the motherboard 24, and are connected to the motherboard 24.

The motherboard 24 is a printed circuit board (PCB) on which a central processing unit (CPU) 30, a communication module 31, a DC/DC converter 32, a solid state drive (SSD) 33, etc. are mounted. The motherboard 24 is placed under the keyboard 20, and is screwed into the top cover member 14a. In the motherboard 24, a top surface 24a serves as an attaching surface with respect to the top cover member 14a, and a bottom surface 24b serves as a mounting surface for electronic components such as the CPU 30 and the communication module 31. Some of the electronic components may be mounted on the top surface 24a. The motherboard 24 forms a substantially T-shape in planar view, and extends over the left and right at the rear of the chassis 14.

The CPU 30 performs calculations relating to the main control and processing of the electronic apparatus 10. The CPU 30 is the largest heating element among the electronic components mounted inside the chassis 14. The communication module 31 is a device that performs information processing of radio communication transmitted and received via an antenna (not illustrated) mounted on the display chassis 12 or the chassis 14. The communication module 31 corresponds to the fifth-generation mobile communication system, for example. The DC/DC converter 32 converts a DC-power voltage supplied from the battery device 26 into a voltage required for each electronic component such as the CPU 30. The SSD 33 is a storage device using a semiconductor memory, instead of a disk drive. The communication module 31, the DC/DC converter 32, and the SSD 33 are heating elements following the CPU 30.

On the motherboard 24 according to one or more embodiments, the CPU 30, the DC/DC converter 32, and the SSD 33 are arranged side by side in a substantially horizontal row, and the communication module 31 is arranged in the front of the CPU 30. It is obvious that the arrangement of the CPU 30 etc. can be appropriately changed.

The cooling module 22 is a cooling device that absorbs and diffuses heat generated by heating elements such as the CPU 30, the communication module 31, the DC/DC converter 32, and the SSD 33, and further radiates the heat to the outside of the chassis 14. The electronic components to be cooled by the cooling module 22 may be components other than the CPU 30, the communication module 31, the DC/DC converter 32, and the SSD 33. For example, they may include various heating elements, which generate heat during the operation of the electronic apparatus 10, such as various arithmetic devices such as a graphics processing unit (GPU), and image chips and components for camera.

Figure 3:
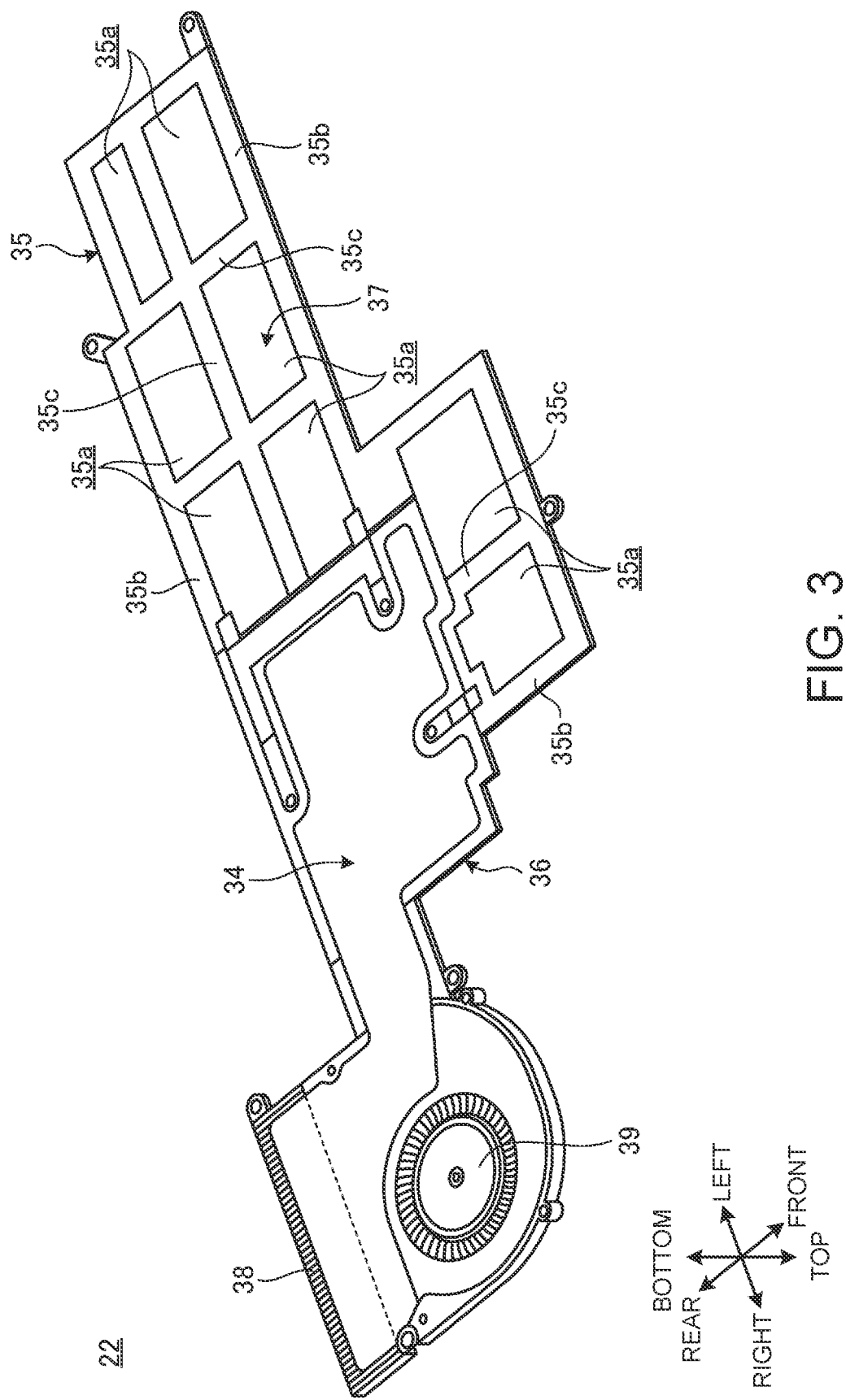
FIG. 3 is a perspective view illustrating a cooling module.
Figure 4:
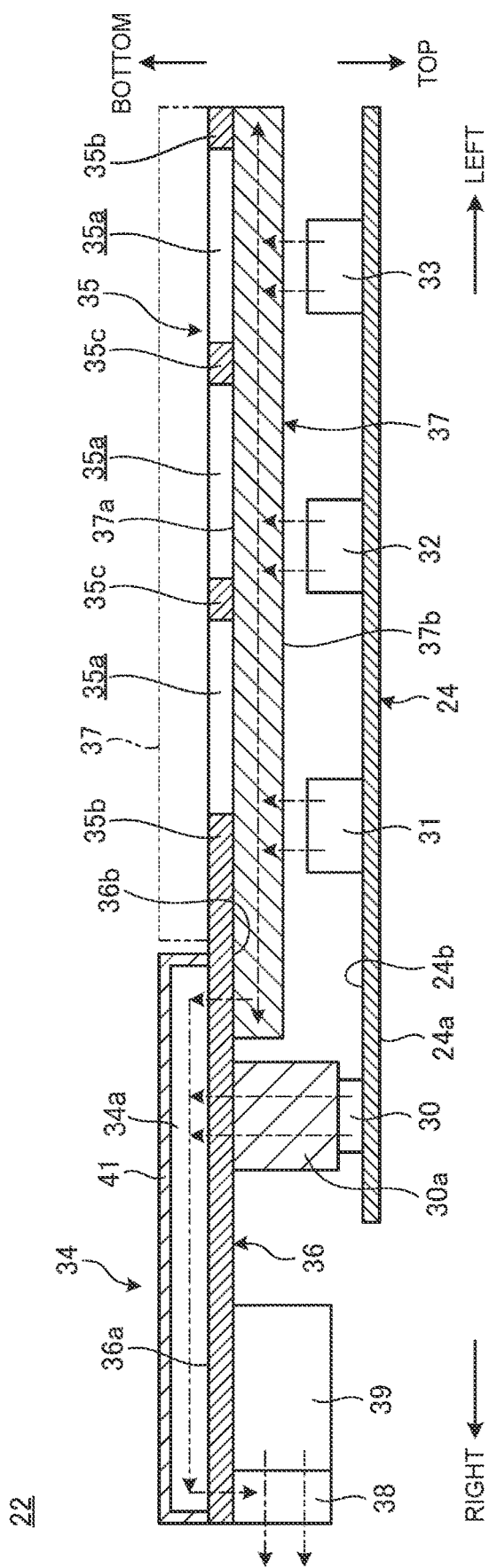
FIG. 4 is a schematic side sectional view illustrating the cooling module and a motherboard.

FIG. 3 is a perspective view illustrating the cooling module 22. FIG. 4 is a schematic side sectional view illustrating the cooling module 22 and the motherboard 24. FIG. 4 illustrates the communication module 31 side by side on the right of the CPU 30 to clarify the function of the cooling module 22. As illustrated in FIGS. 3 and 4, the cooling module 22 includes a vapor chamber 34, a metal plate 36 integrally formed with a metal frame 35, a heat conduction plate 37, a cooling fin 38, and a blower fan 39.

As illustrated in FIGS. 2 to 4, the vapor chamber 34 forms a substantially crank shape in planar view. The vapor chamber 34 extends between the CPU 30 and the cooling fin 38, and transports the heat from the CPU 30 to the cooling fin 38. As illustrated in FIG. 4, the vapor chamber 34 is one in which a sealed space 34a is formed in a portion sandwiched between a metal plate 41 and the metal plate 36 and working fluid is sealed in the sealed space 34a.

The metal plate 41 is a plate formed of metal having high thermal conductivity, such as aluminum, copper, and stainless steel. The metal plate 41 is a lid plate (top plate) of the vapor chamber 34, and has a substantially bathtub shape. The metal plate 36 is a plate formed of metal having high thermal conductivity, such as aluminum, copper, and stainless steel. The metal plate 36 has an outer shape (surface area) larger than that of the metal plate 41. The metal plate 36 is a basal plate (bottom plate) of the vapor chamber 34, and extends over substantially the entire of the cooling module 22.

The sealed space 34a is formed in the inside between the metal plates 41 and 36 by joining the outer peripheral edge of the metal plate 41 to a first surface 36a of the metal plate 36 by welding etc. to be sealed between them. Because the metal plate 41 has an outer shape smaller than that of the metal plate 36, the metal plate 41 is provided to cover only the portion of the first surface 36a of the metal plate 36. FIG.

4 schematically illustrates a joint between the metal plates 41 and 36 as if the end face of the outer peripheral edge of the metal plate 41 is abutted against and joined to the metal plate 36. The actual joint forms a thin flange shape by crushing the outer peripheral edge of the metal plate 41 in the plate thickness direction and joining the metal plate to the first surface 36a, for example.

The vapor chamber 34 is a plate-shaped heat transport device that is one kind of heat pipe. The sealed space 34a becomes a flow path through which the sealed working fluid flows while causing a phase change. Examples of the working fluid may include water, chlorofluorocarbon alternative, acetone, butane, etc., for example. The working fluid according to one or more embodiments is water. A wick (not illustrated) that sends the condensed working fluid by a capillary phenomenon is arranged inside the sealed space 34a. The wick is formed of, for example, a mesh, in which metallic thin wires are woven into a cotton shape, a fine flow path, or the like.

As illustrated in FIG. 4, in the vapor chamber 34 according to one or more embodiments, the CPU 30 is thermally connected to a second surface 36b of a portion of the metal plate 36 that forms the sealed space 34a, that is, a portion of the metal plate 36 that faces the metal plate 41. The CPU 30 is connected to the second surface 36b via a heat receiving member 30a. The heat receiving member 30a is a plate formed of metal having high thermal conductivity, such as aluminum and copper. In the vapor chamber 34, the cooling fin 38 is further thermally connected to the second surface 36b of the metal plate 36. The CPU 30 is arranged at one end (end close to the metal frame 35) of the sealed space 34a. The cooling fin 38 is arranged at the other end (end opposite to the metal frame 35) of the sealed space 34a. As a result, the vapor chamber 34 performs heat transport by repeating a phase change such that working fluid evaporates due to heat from the CPU 30 acting as a heating element to diffuse and move, the heat of the vapor is radiated on the cooling fin 38 to be condensed, and then the condensed working fluid again returns to an endothermic position with respect to the CPU 30.

As illustrated in FIGS. 2 to 4, the metal frame 35 forms a substantially crank shape in planar view. The metal frame 35 is a portion of the metal plate 36, and is formed by a portion of the metal plate 36, which protrudes from the outer shape (the outer peripheral edge) of the metal plate 41. The metal frame 35 is one for supporting the heat conduction plate 37.

The metal frame 35 forms a grid shape having an outer frame 35b and an inner frame 35c by forming cutout holes 35a having a rectangular shape etc. in various places of the metal plate 36. The outer frame 35b is a band-shaped plate portion that extends to border the outer peripheral edge of the metal frame 35. The inner frame 35c is a band-shaped plate portion that is provided in a beam shape on the inner peripheral side of the outer frame 35b. The metal frame 35 according to embodiments is formed in a grid pattern to achieve both weight reduction and high rigidity. As a result, the metal frame 35 can stably support the heat conduction plate 37 while minimizing the weight increase of the cooling module 22.

As illustrated in FIGS. 2 to 4, the heat conduction plate 37 forms a substantially crank shape. The heat conduction plate 37 extends over the substantially entire surface of the metal frame 35 from the edge of a portion overlapping the sealed space 34a on the metal frame 35 side within the second surface 36b of the metal plate 36. The heat conduction plate 37 is a plate containing graphene and has high thermal conductivity. The heat conduction plate 37 is obtained, for example, by melting resin in which a carbon isotope (e.g., containing graphite, carbon nanotube, fullerene, etc.) containing graphene is combined and thermally compressing the resin to cure it in a plate shape. As a graphene plate constituting the heat conduction plate 37, "GHP-200" (product name of Ying Shun company) can be exemplified for example.

As described above, the heat conduction plate 37 is a carbon-based thin plate. Therefore, to ensure sufficient attaching rigidity, the heat conduction plate 37 is supported by the metal frame 35. In the heat conduction plate 37, an attaching surface 37a is fixed to the frames 35b and 35c of the metal frame 35 with a double-sided tape, an adhesive agent, an adhesive, etc.

The heat conduction plate 37 is arranged to overlap the communication module 31, the DC/DC converter 32, the SSD 33, etc., which are heating elements following the CPU 30. In the configuration example illustrated in FIG. 4, in the heat conduction plate 37, a back surface 37b of the attaching surface 37a with respect to the metal frame 35 faces the top surface of a heating element such as the communication module 31 via a slight gap. The heat receiving member 30a, a thermal rubber, etc., similar to the CPU 30 may be interposed between the back surface 37b of the heat conduction plate 37 and the heating element such as the communication module 31.

A portion of the heat conduction plate 37 according to one or more embodiments extends from the metal frame 35 to a portion of the metal plate 36 forming the sealed space 34a and thus the heat conduction plate 37 overlaps the sealed space 34a in the vertical direction (see FIG. 4). As a result, the heat conduction plate 37 can directly transfer heat to the vapor chamber 34.

As illustrated in FIGS. 2 to 4, the cooling fin 38 is arranged to face an exhaust port formed on an outer wall (rear wall in one or more embodiments) of the chassis 14. The cooling fin 38 is one obtained by forming a plurality of slits penetrating in the inside-outside direction of the chassis 14 in a metal block having high thermal conductivity, such as aluminum, copper, and stainless steel. The cooling fin 38 is joined to the second surface 36b of the portion of the metal plate 36 forming the sealed space 34a by welding etc.

As illustrated in FIGS. 2 to 4, the blower fan 39 is attached to the second surface 36b of the metal plate 36 at a position between the cooling fin 38 and the heat receiving member 30a (the CPU 30). The blower fan 39 is close to the cooling fin 38, and discharges air sucked from the inside of the chassis 14 to the outside of the chassis 14 through the slits of the cooling fin 38.

As described above, the cooling module 22 according to one or more embodiments is one in which the vapor chamber 34 that absorbs heat from the CPU 30 that is the largest heating element and the heat conduction plate 37 that absorbs heat from the communication module 31 etc. that are heating elements following the CPU 30 are integrally modularized.

The plate thickness of the vapor chamber 34 is 0.3 mm, for example. In the thickness, the plate thickness of the metal plate 36 is 0.1 mm, and the plate thickness from the first surface 36a of the metal plate 36 to the outer surface of the metal plate 41 is 0.2 mm. Because the metal frame 35 is a portion of the metal plate 36, the plate thickness of the metal frame is 0.1 mm. The plate thickness of the heat conduction plate 37 is 0.2 mm, for example. The plate thickness of the blower fan 39 and the cooling fin 38 is 2.7 mm, for example. Therefore, the cooling module 22 has an extremely thin plate thickness as a whole.

In the cooling module 22, the heat conduction plate 37 is arranged at the lateral side of the thickest blower fan 39. The CPU 30 and the heat receiving member 30a are arranged in a space formed between the blower fan 39 and the heat conduction plate 37, and are thermally connected to the metal plate 36. Moreover, the communication module 31 etc. are arranged in a space formed at a lateral side thereof, and are thermally connected to the heat conduction plate 37. As a result, the cooling module 22 has good space efficiency in the chassis 14 and can secure high cooling performance while minimizing the influence on the plate thickness of the entire chassis 14.

The arrow indicated by a dashed line in FIG. 4 schematically illustrates the transfer of heat. In the cooling module 22, the thermal conductivity of the vapor chamber 34 is about 5000 to 10000 (W/mK). The thermal conductivity of a graphene plate forming the heat conduction plate 37 is about 1600 (W/mK). The thermal conductivity when the metal plate 36 is copper is about 400 (W/mK).

Therefore, the heat generated by the CPU 30 is transferred from the heat receiving member 30a to the vapor chamber 34, and is transferred to the cooling fin 38 with extremely high efficiency. On the other hand, the heat generated by the communication module 31 etc. is transferred to the heat conduction plate 37 having a thermal conductivity about four times higher than that of a copper plate, and is diffused and radiated with high efficiency. In this case, the portion of the heat conduction plate 37 overlaps the sealed space 34a in the vertical direction with the metal plate 36 interposed therebetween. For this reason, because part of heat of the communication module 31 etc. is transported to the cooling fin 38 via the vapor chamber 34 with high efficiency, higher heat dissipation performance is obtained.

Moreover, the density of the heat conduction plate 37 containing graphene is about 1.5 (g/cm$^3$), for example, and is considerably light compared to the density of a copper plate that is about 8.9 (g/cm$^3$) for example. In other words, the cooling module 22 forms a heat diffusion plate with the heat conduction plate 37 containing graphene. For this reason, the cooling module 22 enables considerable weight reduction even considering the weight of the metal frame 35 compared to a configuration that the heat diffusion plate is formed of a copper plate.

Figure 5:
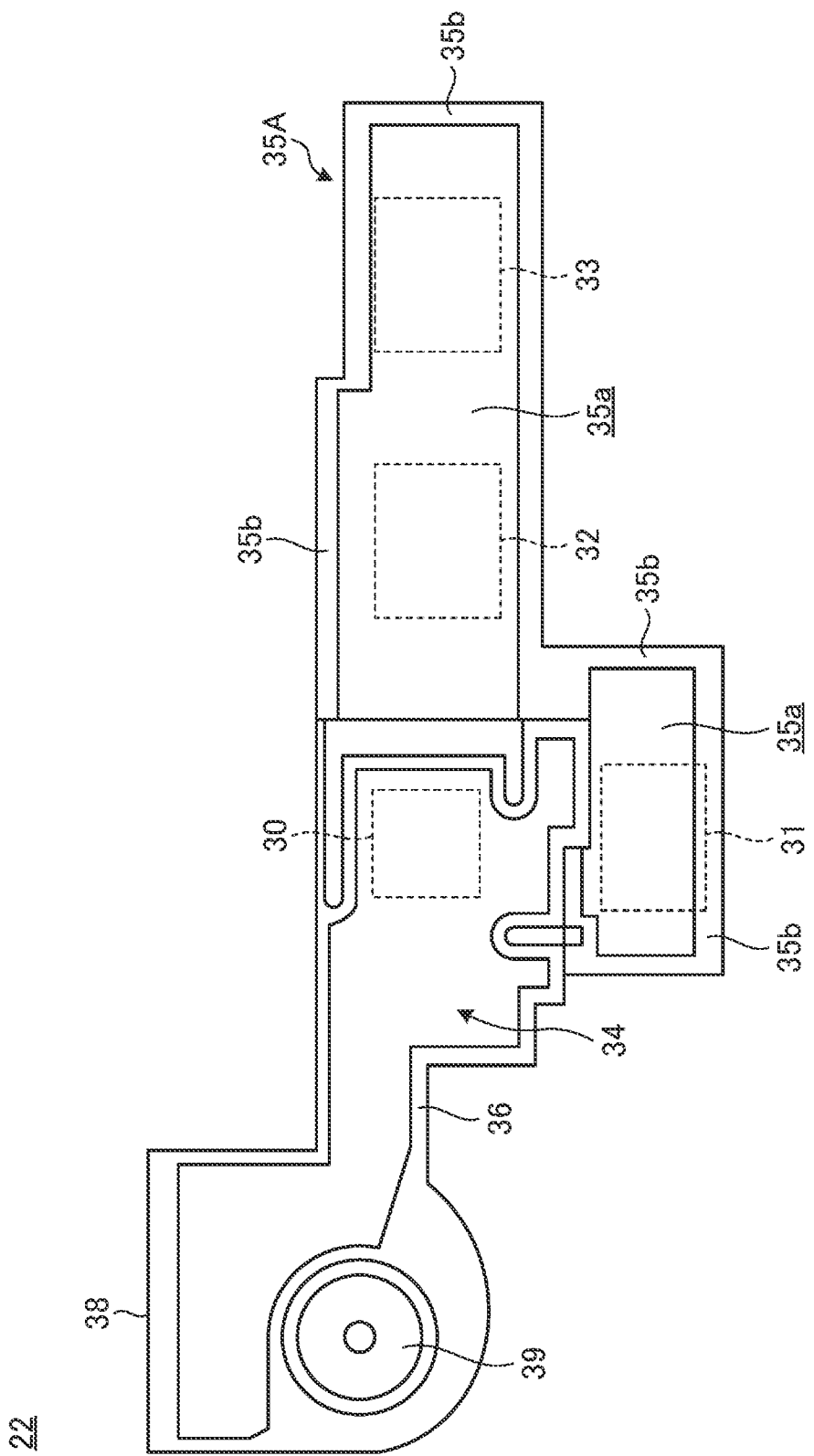
FIG. 5 is a schematic plan view illustrating the cooling module including a metal frame according to a modification example.

FIG. 5 is a schematic plan view illustrating the cooling module 22 including a metal frame 35A according to a modification example. The metal frame 35 described above has a grid shape. On the contrary, the metal frame 35A illustrated in FIG. 5 does not include the inner frame 35c, and is formed in a frame shape only by the outer frame 35b. As a result, the metal frame 35A can secure the required rigidity while achieving further weight reduction than the metal frame 35.

As described above, the electronic apparatus 10 according to one or more embodiments includes, inside the chassis 14, the CPU 30 that is the first heating element, the communication module 31 etc. that are the second heating elements, and the cooling module 22. The cooling module 22 includes the vapor chamber 34, the metal frame 35 formed in the metal plate 36 constituting the vapor chamber 34, and the heat conduction plate 37 supported by the metal frame 35 and containing graphene. Herein, the vapor chamber 34 is arranged to be able to absorb the heat generated by the CPU 30, and the heat conduction plate 37 is arranged to be able to absorb the heat generated by the communication module 31 etc.

Therefore, in the cooling module 22, two types of heat transport members are integrally modularized by providing the vapor chamber 34 and the heat conduction plate 37 corresponding to heat absorption of different heating elements with respect to the one metal plate 36. As a result, the cooling module 22 reduces the number of parts and facilitates assembly into the chassis 14. Moreover, the heat conduction plate 37 is formed of a plate containing graphene, and thus enables more considerable weight reduction than the conventional metallic heat diffusion plate made of copper etc. Moreover, because the heat conduction plate 37 formed of carbon-based material as described above is supported by the metal frame 35, there are no problems with respect to rigidity or attaching stability.

Figure 6:
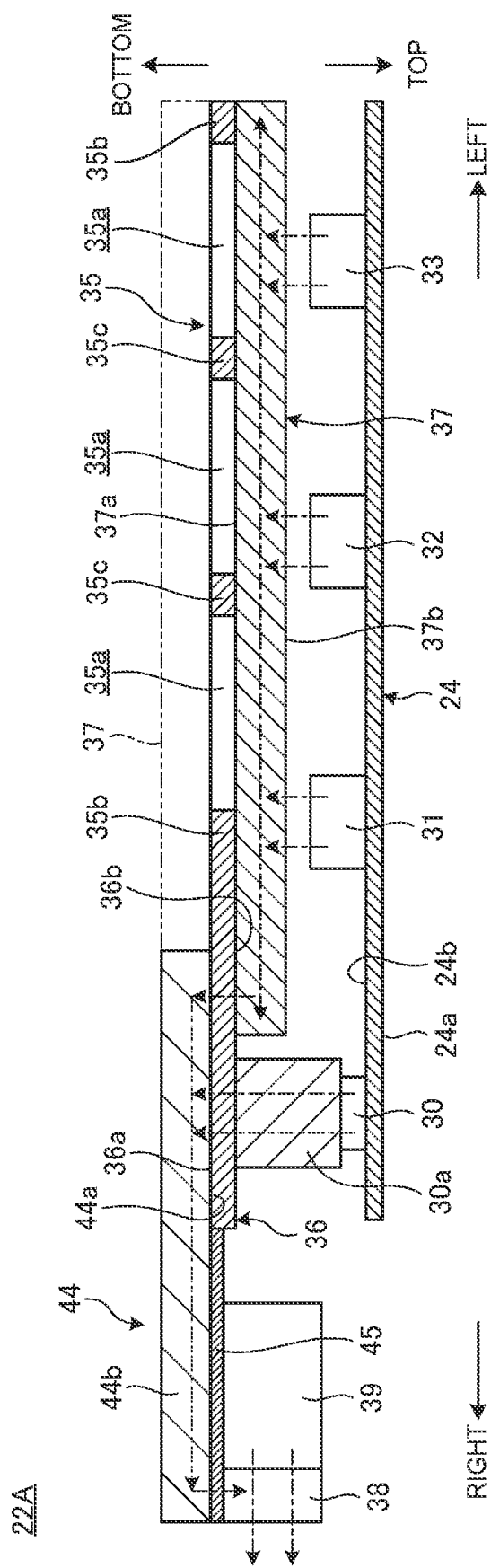
FIG. 6 is a schematic side sectional view illustrating the cooling module and the motherboard according to the modification example.
Figure 7:
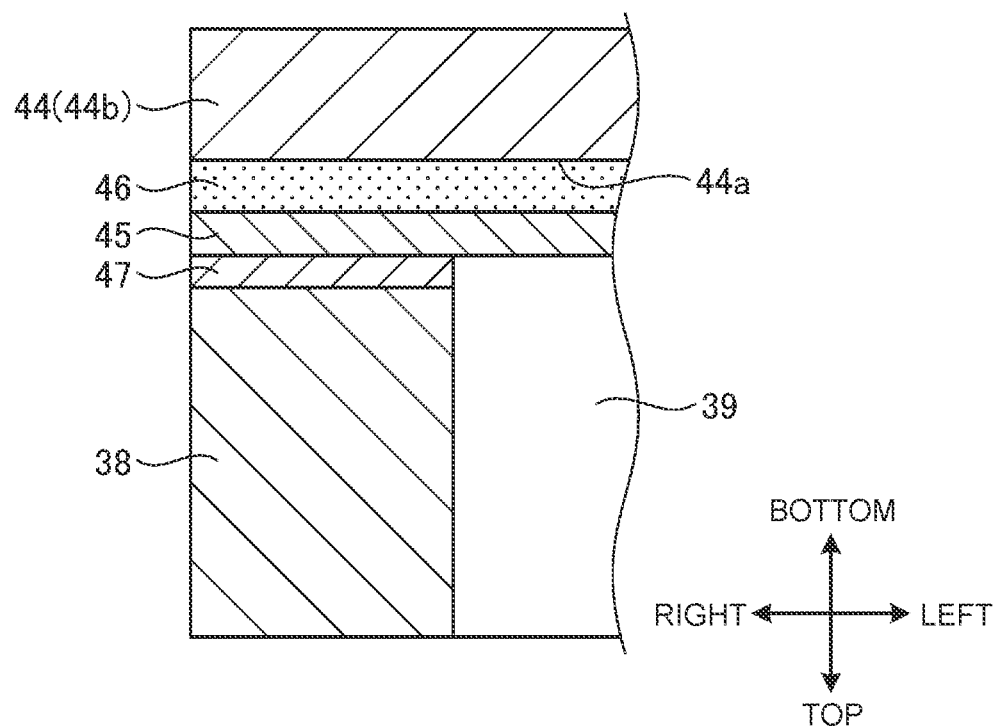
FIG. 7 is an enlarged view illustrating a cooling fin and its peripheral parts of the cooling module illustrated in FIG. 6.

FIG. 6 is a schematic side sectional view illustrating a cooling module 22A and the motherboard 24 according to the modification example. FIG. 7 is an enlarged view illustrating the cooling fin 38 and its peripheral parts of the cooling module 22A illustrated in FIG. 6. In the cooling module 22A illustrated in FIG. 6, the same reference numbers as the reference numbers illustrated in FIGS. 1 to 5 indicate the same or similar configuration, and thus detailed description will be omitted as they have the same or similar functions and effects.

The cooling module 22A illustrated in FIG. 6 is different from the cooling module 22 illustrated in FIG. 4 in that a heat conduction plate 44 and a metal sheet 45 are included instead of the vapor chamber 34.

The heat conduction plate 44 has substantially the same planar shape as the metal plate 41 of the vapor chamber 34 described above. The heat conduction plate 44 is attached to the first surface 36a of the metal plate 36. The heat conduction plate 44 may have the same or similar structure as the heat conduction plate 37 described above, and is a plate containing graphene. An attaching surface 44a of the heat conduction plate 44 is fixed to the first surface 36a of the metal plate 36 with a double-sided tape, an adhesive agent, an adhesive, etc. As illustrated in FIG. 6, the metal plate 36 of the cooling module 22A has a smaller outer shape than that of the configuration example illustrated in FIG. 4. The heat conduction plate 44 has, at a side opposite to the metal frame 35, a portion (protruding portion 44b) protruding from the outer shape of the metal plate 36 in a state of being fixed to the first surface 36a of the metal plate 36. Also in the cooling module 22A, the portion of the heat conduction plate 37 overlaps the heat conduction plate 44 in the vertical direction with the metal plate 36 interposed therebetween.

The metal sheet 45 is a sheet formed of metal having high thermal conductivity, such as aluminum and copper. The metal sheet 45 according to one or more embodiments is a copper sheet. The metal sheet 45 is fixed to the protruding portion 44b protruding from the metal plate 36 in the attaching surface 44a of the heat conduction plate 44 with respect to the metal plate 36. The metal sheet 45 is an intermediate member for strongly fixing the cooling fin 38 made of metal with an uneven surface to the heat conduction plate 44 formed of carbon-based material. The plate thickness of the metal sheet 45 is about 12 μm, for example.

As illustrated in FIG. 7, the metal sheet 45 is fixed to the attaching surface 44a of the heat conduction plate 44 by using a fixing member 46 such as a double-sided tape, an adhesive agent, and an adhesive. The fixing member 46 according to one or more embodiments is a double-sided adhesive tape having high thermal conductivity. The plate thickness of the fixing member 46 is about 15 µm, for example. The metal sheet 45 is a sheet-like or foil-like member having high flatness on both the top and bottom surfaces, and can be firmly fixed to the heat conduction plate 44 via the fixing member 46.

The top surface of the cooling fin 38 is strongly joined to the metal sheet 45 by a joint 47. The joint 47 is a joint formed by welding containing tin, for example. The thickness of the joint 47 is about 10 µm, for example. The top surface of the cooling fin 38 has an uneven shape as described above. However, the cooling fin 38 is strongly joined to the metal sheet 45 by the joint 47 by welding, and consequently the cooling fin 38 is strongly fixed to the heat conduction plate 44.

The arrow indicated by a dashed line in FIG. 6 schematically illustrates the transfer of heat. The cooling module 22A employs the heat conduction plate 44 that achieves considerable weight reduction that much, although the thermal conductivity of the heat conduction plate 44 is inferior to that of the vapor chamber 34. For this reason, the cooling module 22A enables further weight reduction than the cooling module 22 described above. Moreover, also in the cooling module 22A, the heat of the CPU 30 is transferred from the heat receiving member 30a to the heat conduction plate 44, and is transferred to the cooling fin 38 with high efficiency. On the other hand, the heat of the communication module 31 etc. is diffused and radiated inside the heat conduction plate 37 with high efficiency, and part of the heat is transferred from the metal plate 36 to the heat conduction plate 44 and is transported to the cooling fin 38 with high efficiency.

The present invention is not limited to the above-described embodiments, and the embodiments can be freely changed without departing from the gist of the present invention.

DESCRIPTION OF SYMBOLS

10 Electronic apparatus
14 Chassis
22, 22A Cooling module
30 CPU
31 Communication module
32 DC/DC converter
33 SSD
34 Vapor chamber
34a Sealed space
35, 35A Metal frame
36, 41 Metal plate
37, 44 Heat conduction plate
38 Cooling fin
39 Blower fan
45 Metal sheet.

The invention claimed is:

1. An electronic apparatus comprising:
a chassis;
first and second heating elements provided inside the chassis; and
a cooling module configured to absorb heat generated by the first and second heating elements,
the cooling module comprising:
a vapor chamber in which a sealed space is formed in a portion sandwiched between first and second metal plates and working fluid is sealed in the sealed space, the second metal plate comprising an outer shape larger than that of the first metal plate;
a metal frame formed in a portion of the second metal plate, the portion of the second metal plate protruding from the outer shape of the first metal plate; and
a heat conduction plate supported by the metal frame, the heat conduction plate containing graphene, wherein
the vapor chamber absorbs the heat generated by the first heating element, and
the heat conduction plate absorbs the heat generated by the second heating element.

2. The electronic apparatus according to claim 1, wherein the metal frame is formed in a frame shape or in a grid shape by forming cutout holes in the protruding portion of the second metal plate.

3. The electronic apparatus according to claim 1, wherein
the sealed space is formed on a first surface of the second metal plate,
the first heating element is connected via a heat receiving member to a second surface of the second metal plate in the portion forming the sealed space,
the heat conduction plate is fixed to a surface of the metal frame corresponding to the second surface of the second metal plate, and
the second heating element radiates heat toward a back surface of an attaching surface of the heat conduction plate with respect to the metal frame.

4. The electronic apparatus according to claim 3, wherein the heat conduction plate extends from the metal frame to the portion of the second metal plate forming the sealed space to overlap the sealed space in a vertical direction.

5. The electronic apparatus according to claim 1, wherein the cooling module further comprises:
a cooling fin thermally connected to the second metal plate; and
a blower fan that blows air to the cooling fin.

6. An electronic apparatus comprising:
a chassis;
first and second heating elements provided inside the chassis; and
a cooling module that absorbs heat generated by the first and second heating elements,
the cooling module comprising:
a metal plate;
a first heat conduction plate fixed to a first surface of the metal plate, the first heat conduction plate containing graphene and comprising a portion protruding from an outer shape of the metal plate;
a second heat conduction plate fixed to the first surface or a second surface of the metal plate, the second heat conduction plate containing graphene;
a metal sheet fixed to the portion of the first heat conduction plate protruding from the outer shape of the metal plate in an attaching surface of the first heat conduction plate with respect to the metal plate;
a cooling fin joined to the metal sheet; and
a blower fan that blows air to the cooling fin, wherein
the first heat conduction plate absorbs the heat generated by the first heating element, and
the second heat conduction plate absorbs the heat generated by the second heating element.

7. The electronic apparatus according to claim 6, wherein a portion of the metal plate to which the second heat conduction plate is fixed is formed in a frame shape or in a grid shape by forming cutout holes.

8. The electronic apparatus according to claim 6, wherein the second heat conduction plate is fixed to the second surface of the metal plate, and the first heat conduction plate and the second heat conduction plate overlap with each other in a vertical direction with the metal plate interposed therebetween.

\* \* \* \* \*